United States Patent
Ruckerbauer et al.

(10) Patent No.: US 7,698,470 B2
(45) Date of Patent: Apr. 13, 2010

(54) INTEGRATED CIRCUIT, CHIP STACK AND DATA PROCESSING SYSTEM

(75) Inventors: Hermann Ruckerbauer, Moos (DE); Dominique Savignac, Ismaning (DE)

(73) Assignee: Qimonda AG, Munich (DE)

( * ) Notice: Subject to any disclaimer, the term of this patent is extended or adjusted under 35 U.S.C. 154(b) by 197 days.

(21) Appl. No.: 11/834,617

(22) Filed: Aug. 6, 2007

(65) Prior Publication Data

US 2009/0039915 A1    Feb. 12, 2009

(51) Int. Cl.
*G06F 3/00* (2006.01)
*H03K 19/173* (2006.01)
*H01L 25/00* (2006.01)

(52) U.S. Cl. .............................. 710/14; 326/38; 326/47
(58) Field of Classification Search .................... 710/14
See application file for complete search history.

(56) References Cited

U.S. PATENT DOCUMENTS

| | | | |
|---|---|---|---|
| 4,649,516 A * | 3/1987 | Chung et al. ........... 365/230.05 |
| 5,454,160 A * | 10/1995 | Nickel .......................... 29/840 |
| 5,754,780 A * | 5/1998 | Asakawa et al. ............ 709/208 |
| 6,237,495 B1 | 5/2001 | Hok et al. |
| 6,401,142 B1 * | 6/2002 | Williams et al. .............. 710/14 |
| 6,448,661 B1 | 9/2002 | Kim et al. |
| 6,944,723 B2 * | 9/2005 | Shinkawa et al. ........... 711/151 |
| 7,383,416 B2 | 6/2008 | Oeschay et al. |
| 2002/0109236 A1 | 8/2002 | Kim et al. |
| 2003/0006979 A1 * | 1/2003 | Tsuchi et al. ............... 345/204 |
| 2005/0082664 A1 | 4/2005 | Funaba et al. |
| 2006/0043535 A1 | 3/2006 | Hiatt |
| 2006/0206745 A1 | 9/2006 | Prengel et al. |
| 2007/0061614 A1 | 3/2007 | Choi |

FOREIGN PATENT DOCUMENTS

DE    10 2005 011 368 A1    8/2006
DE    10 2006 023 172 A1    12/2006

OTHER PUBLICATIONS

"JEDEC Standard: DDR3 SDRAM Standard," JEDEC Solid State Technology Association, JESD 79-3, Jun. 2007, 186 pages, JEDEC Engineering Standards and Publications, Arlington, VA.

* cited by examiner

*Primary Examiner*—Henry W. H. Tsai
*Assistant Examiner*—Juanito C Borromeo
(74) *Attorney, Agent, or Firm*—Slater & Matsil, L.L.P.

(57) ABSTRACT

An integrated circuit includes a first connection and a memory circuit. The integrated circuit is switchable between a master mode of operation, in which a buffer between the first connection and the memory circuit is activated, and a slave mode of operation, in which the buffer between the first connection and the memory circuit is deactivated.

38 Claims, 11 Drawing Sheets

INTEGRATED CIRCUIT, CHIP STACK AND DATA PROCESSING SYSTEM

TECHNICAL FIELD

Embodiments of the invention relate to an integrated circuit, a chip stack and a data processing system.

BRIEF DESCRIPTION OF THE DRAWINGS

For an understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
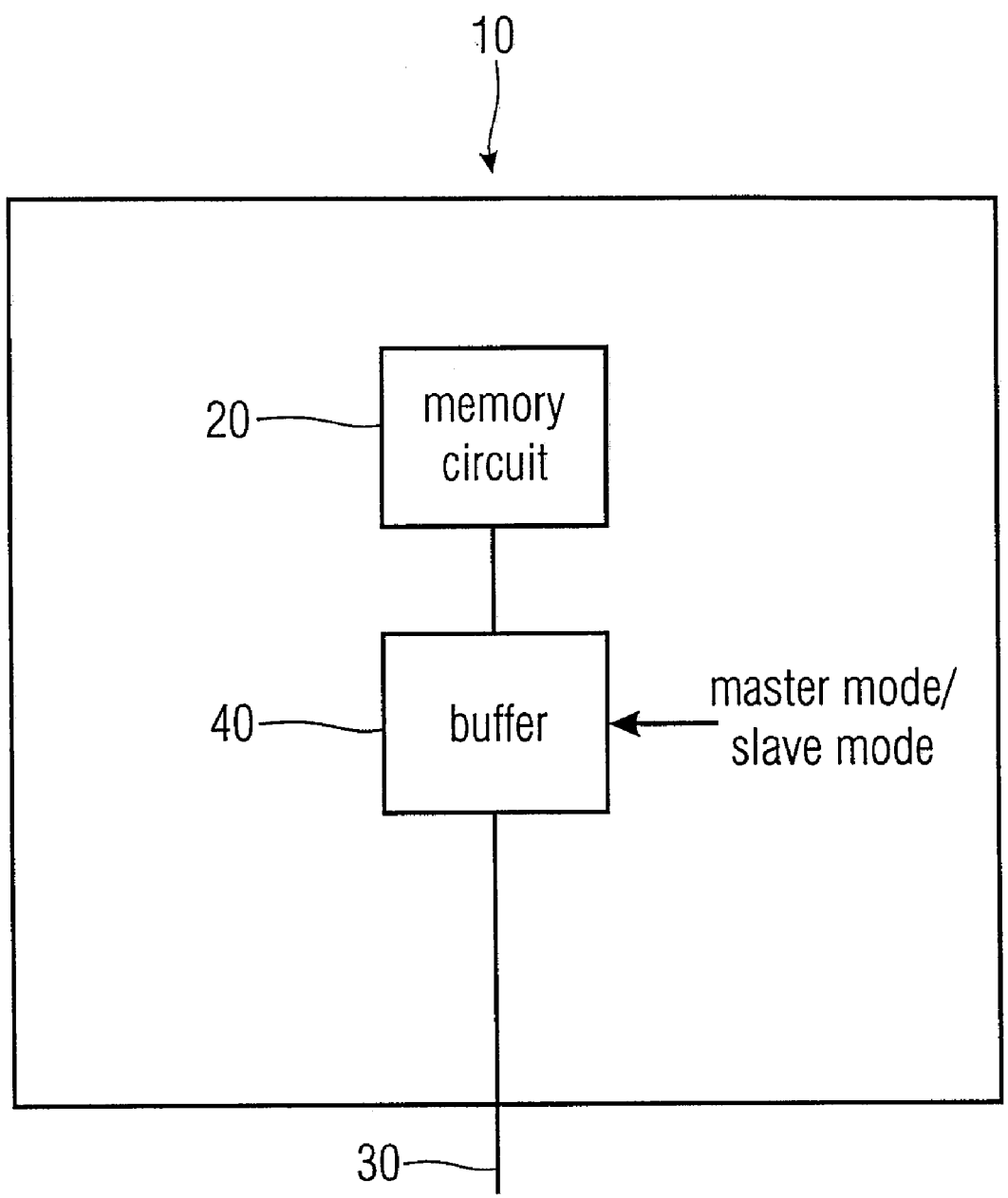
FIG. 1a shows a block schematic diagram of a memory chip according to an embodiment of the invention.

FIG. 1a shows a block schematic diagram of a memory chip (or, more generally, an integrated circuit comprising a memory), according to an embodiment of the invention. The memory chip is designated in its entirety with 10.

The memory chip 10 comprises a memory circuit 20. Moreover, the memory chip 10 comprises a connection or first connection 30 and a buffer 40 circuited between the first connection 30 and the memory circuit 20.

The memory chip 10 is switchable between a master mode of operation, in which the buffer 40 between the first connection 30 and the memory circuit 20 is activated, and a slave mode of operation, in which the buffer 40 is deactivated.

Accordingly, the memory chip 10 with a switchable buffer 40 is provided such that the memory chip 10 can, for example, be operated in a master mode and in a slave mode. In the master mode, the memory chip 10 may be used to receive data via the first connection 30, and to forward the received and buffered data, for example to another memory chip (not shown) (for example via a second connection not shown). Moreover, in some embodiments the memory chip 10 may also be able to receive data, for example from another memory chip, and to forward the data via the buffer 40 and the first connection 30.

In the slave mode, the buffer 40 is deactivated and may not contribute significantly to power consumption. Also, in the slave mode the buffer 40 may be set to a state in which the buffer 40 does not interfere with any other communication paths within the memory chip 10. According to some embodiments, the memory chip 10 may perform a data exchange with the memory circuit 20 via some other connection (other than the first connection 30). For example, the memory chip 10 may receive data (e.g., address data, control data or memory data) from another memory chip (which may or may not be identical to the memory chip 10). Besides, according to some embodiments, the memory chip 10 being in the slave mode may forward data to another memory chip being in the master mode, wherein, for example, the memory chip being in the master mode may serve as a buffer device.

Thus, according to some embodiments, a set of memory chips 10 may be provided, wherein one of the memory chips 10 is configured to be operated in the master mode of operation, and wherein at least one of the memory chips 10 is operated in the slave mode of operation. The memory chip 10 operated in the master mode of operation may serve as a buffer device for the memory chips 10 operated in the slave mode of operation.

According to some other embodiments, a chip stack may comprise at least two master devices. In some embodiments, at least one slave device may be associated with each master device. In other words, a first master device (e.g., a memory chip configured to operate in the master mode of operation) may be coupled to a corresponding first slave device (e.g., a memory chip configured to operate in the slave mode of operation). A second master device (e.g., a memory chip configured to operate in the master mode of operation) may be coupled with a second slave device (e.g., a memory chip configured to operate in the slave mode of operation).

Figure 1B:
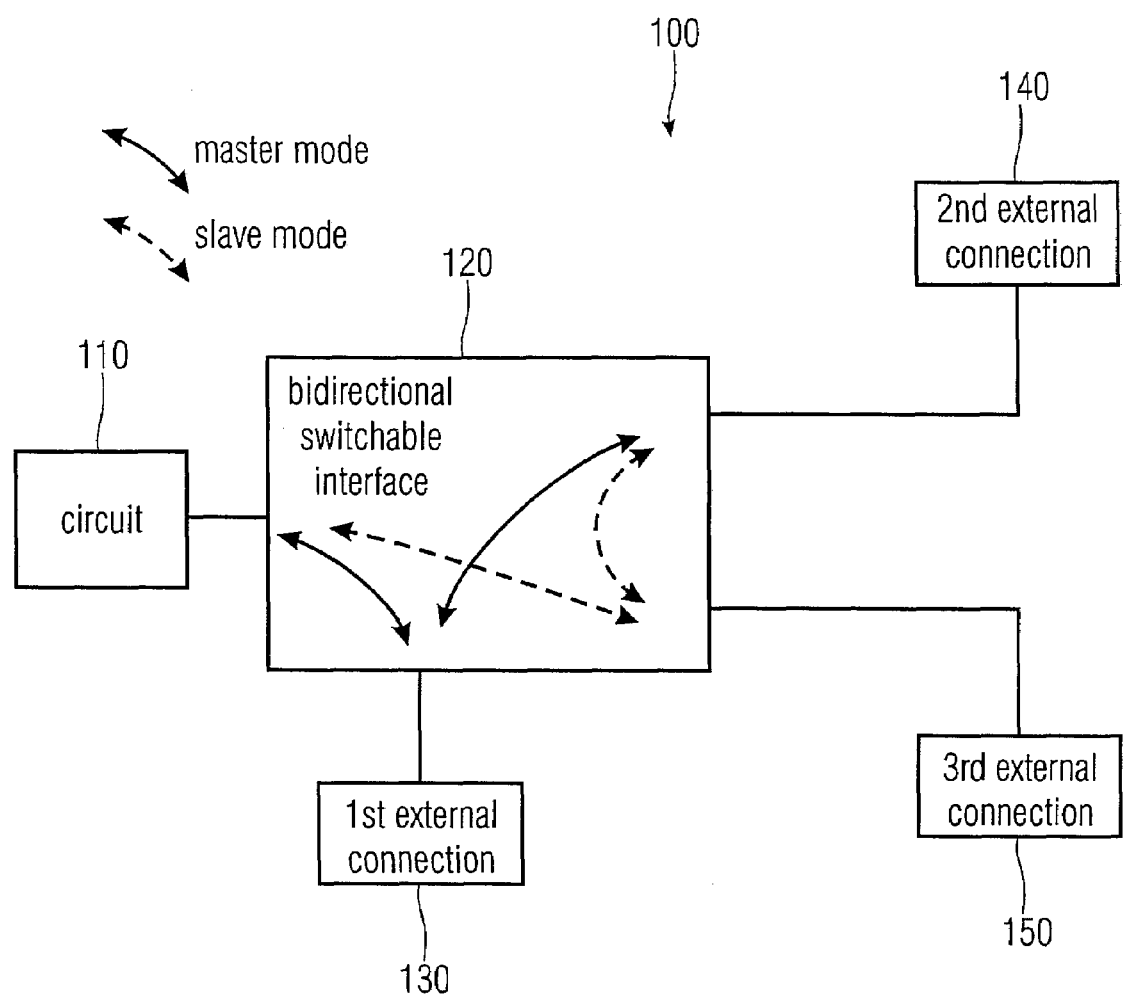
FIG. 1b shows a block schematic diagram of a memory chip according to another embodiment of the invention.

FIG. 1b shows a block schematic diagram of a memory chip according to an embodiment of the present invention. The memory chip of FIG. 1b is designated in its entirety with 100. The memory chip 100 comprises a circuit 110. A signal port of the circuit 110 (which may, for example, be a memory circuit) is coupled to a switchable interface 120. The switchable interface 120 may, for example, be a unidirectional or bidirectional interface. In the following, reference will be taken to a bidirectional interface, but the memory chip 100 can also be implemented using a unidirectional interface (which naturally provides a limitation of the functionality). The memory chip 100 further comprises a first connection 130 (which may, for example, be an external connection, and which may have a similar function like the connection 30), a second connection 140 (which may, for example, be an external connection) and a third connection 150 (which may, for example, be an external connection). The first external connection 130 is coupled to the bidirectional switchable interface 120. Moreover, the second external connection 140 and the third external connection 150 are also coupled to the bidirectional switchable interface 120.

In an embodiment, the second external connection 140 and the third external connection 150 may be located at opposite main surfaces of the memory chip 100.

The memory chip 100 is configured to be operable both in a master mode of operation and in a slave mode of operation.

As can be seen from FIG. 1b, the bidirectional switchable interface 120 is circuited between the first external connection 130 and a signal port of the circuit 110. Moreover, the bidirectional switchable interface 120 is circuited between the first external connection 130 and the second external connection 140. In addition, the bidirectional switchable interface 120 is circuited between the first external connection 130 and the third external connection 150. The bidirectional switchable interface 120 is configured to provide an effective electrical coupling between the first external connection 130 and the second external connection 140 or between the first external connection 130 and the circuit 110 in a master mode of operation. The possible connections in the master mode of operation are shown in the graphical representation of FIG. 1b as solid arrows within the bidirectional switchable interface 120. The bidirectional switchable interface 120 is further configured to allow for a data exchange between the third external connection 150 and the signal port of the circuit 110 in the slave mode of operation or to allow for a data exchange between the second external connection 140 and the third external connection 150 in the slave mode of operation. Possible connections in the slave mode of operation are shown in the graphical representation of FIG. 1b as dashed arrows.

To summarize the above, the memory chip 100 comprises a bidirectional (or unidirectional) switchable interface 120, which can be configured based on the mode of operation, and which may, for example, comprise a buffer. In the master mode of operation, the first external connection 130 may participate in the data exchange and, therefore, may serve as a connection between the memory chip 100 and an external environment. In the slave mode of operation, data exchange between the circuit 110 and the third external connection 150 may be provided or data exchanged between the second external connection 140 and the third external connection 150 may be provided. Consequently, the third external connection 150 may provide a connection between several (possibly identical) memory chips and replace the first external connection 130 in the slave mode of operation.

The above-described memory chip allows for a particularly flexible usage of the memory chip 100. The memory chip 100 can be used as a stand-alone memory chip, wherein an electrical connection with an environment may be provided via the first electrical connection 130. In addition, the memory chip 100 can also be used as a master device in a set-up comprising a plurality of memory chips 100. In this case, the memory chip 100 may provide for a data exchange to its own circuit 110 (which may for example be a memory circuit for storing data, comprised in the memory chip 100) wherein the bidirectional switching interface 120 and the first external connection 130 may also route a signal from the first external connection 130 to the second external connection 140 to which another memory chip 100 may be connected. When operating in the slave mode of operation, the memory chip 100 may either provide a data connection between the third external connection 150 and the circuit 110, for example, to allow for a data access to the circuit 110 via the third external connection 150, or may provide a data connection between the third external connection 150 and the second external connection 140 to serve as a data forwarding device.

Consequently, it can be noted that the memory chip 100 of FIG. 1b enables the implementation of a stack of identical memory chips 100, which can be operated as a master or as a slave according to the requirements. Thus, costs for the provision of different memory chips can be avoided, as, in some embodiments, a single memory chip will be used either as a stand-alone memory chip, as a master memory chip in a stack of memory chips, or as a slave memory chip in a stack of memory chips. Consequently, some of the above-described embodiments may make it possible to significantly reduce the production costs for memory chips and, therefore, may help to improve the competitiveness of the manufacturer of memory chips.

In an alternative embodiment, the memory chip 100 may comprise a single, common connection replacing the second connection 140 and the third connection 150. This single, common connection (not shown) may take over the functionalities of both the second external connection 140 and the third external connection 150. In this case, the bidirectional switchable interface 120 may be configured to provide an effective electrical coupling between the first external connection 130 and the common external connection or between the first external connection 130 and the circuit 110 in the master mode of operation. The bidirectional switchable interface 120 may further be configured to allow for a data exchange between the common connection and the signal port of the circuit 110 in the slave mode of operation.

In another embodiment, the second connection 140 and the third connection 150 may be directly connected, for example via a conductor, like a wire, a conductive trace or a via (e.g., a thru-semiconductor-via or a thru-chip-via).

In the following, some possible (optional) extensions to the above-described memory chip 100 will be described.

Figure 2:
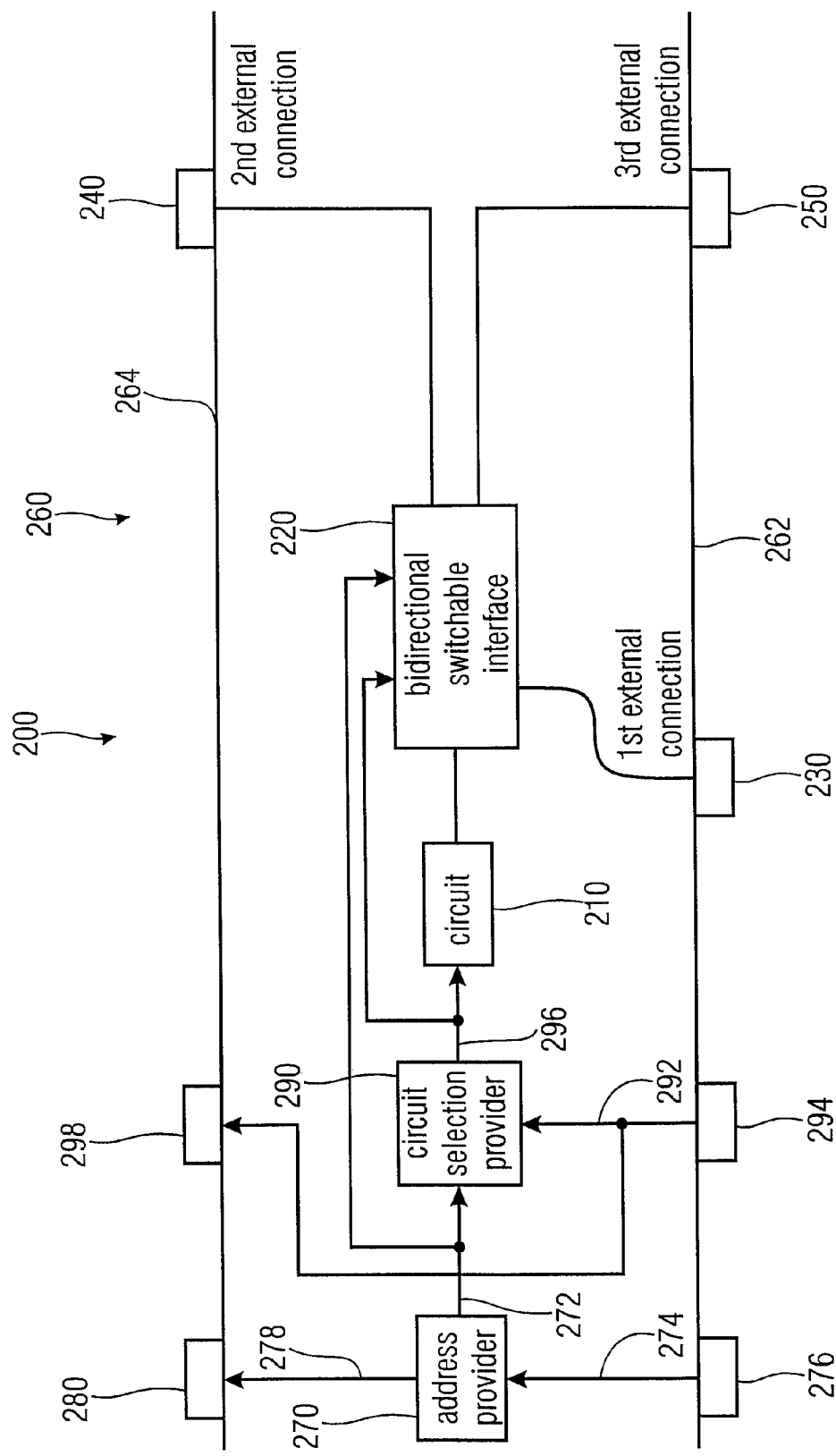
FIG. 2 shows a block schematic diagram of a memory chip according to another embodiment of the invention.

FIG. 2 shows a block schematic diagram of a memory chip according to another embodiment of the present invention. The memory chip of FIG. 2 is designated in its entirety with 200. The memory chip 200 comprises a memory circuit 210, which is equivalent to the circuit 110. Moreover, the memory chip 200 comprises a bidirectional switchable interface 220, which is equivalent to the bidirectional switchable interface 120. The memory circuit 210 (also briefly designated as "circuit 210" in the following) is coupled with the bidirectional switchable interface 220. Moreover, the memory chip 200 comprises a first external connection 230, a second external connection 240, and a third external connection 250. The first external connection 230, the second external connection 240, and the third external connection 250 are equivalent to the external connections 130, 140, and 150, respectively. The external connections 230, 240, 250 are coupled to the bidirectional switchable interface 220, as shown in FIG. 2. It should be noted here that the bidirectional switchable interface 220 may, for example, fulfill the same functionality as the bidirectional switchable interface 120. However, it should be noted that in an embodiment the circuit 210 and the bidirectional switchable interface 220 are part of an integrated circuit chip 260. The chip 260 comprises a first main surface 262 (for example, a "bottom" surface) and a second main surface 264 (for example, a "top" surface). In an embodiment, the first external connection 230 and the third external connection 250 are arranged on the first surface 262 of the chip 260. In an embodiment, the first external connection 230 is adapted for providing a connection to an external environment of the chip 260, i.e., for providing a contact to an external component. For example, the first external connection 230 may be a bond pad adapted for attaching a bond wire. However, the third external connection may be adapted to provide a connection with another chip.

In an embodiment, the second external connection 240 is arranged on the second surface 264 of the chip 260, and may be adapted to provide a connection to another chip. In an embodiment, the second external connection 240 may be located geometrically opposite the third external connection 250, such that the second external connection 240 of a first chip is in electrical contact with the third external connection 250 of a second chip when the second chip is stacked on top of the first chip.

In an embodiment, the third external connection 250 may be connected with the second external connection 240 directly via a through-silicon via (TSV) reaching through the chip 260.

The memory chip 200 may further comprise an optional address provider 270. The address provider 270 may, for example, be adapted to provide address information 272. The address information 272 may, for example, identify the chip 260. Moreover, the bidirectional switchable interface 220 may be configured to determine its mode of operation based on the address information 272. For example, the bidirectional switchable interface 220 may be configured to operate in the master mode of operation if the address information 272 indicates a certain predetermined address or to otherwise operate in the slave mode of operation. Consequently, the bidirectional switchable interface 220 may determine the possible data paths based on the address information 272. The address provider 270 may, for example, be adapted to receive address input information 274 from an address input connection 276, wherein the address input connection 276 may, for example, be located on the same main surface 262 of the chip 260 as the first external connection 230 and the third external connection 250. The address provider 270 may be adapted to provide the address information 272 on the basis of the address input information 274. Moreover, the address provider 270 may be adapted to provide address output information 278 to an address output connection 280. The address output connection 280 may, for example, be located on the same main surface 264 of the chip 260 as the second external connection 240. Moreover, in an embodiment, the address output connection 280 may be arranged geometrically opposite the address input connection 276. For example, the address output connection 280 may be located such that the address output connection 280 of a first chip is in electrical contact with the address input connection 276 of a second chip when the second chip is stacked on the first chip. For example, the address provider 270 may be adapted to provide the address output information 278 on the basis of the address input information 274, such that the address output information 278 encodes a different address value than the address input information 274. It should be noted that the address input connection 276 may comprise one or more electrical contacts for one or more individual signals. Similarly, the address output connection 280 may comprise two or more contacts for two or more output signals. However, in an embodiment, the address input connection 276 and the address output connection 280 are adapted to allow for a hand-over of address information 272 between stacked chips.

In an embodiment, the memory chip 200 may comprise an optional circuit selection provider 290. The circuit selection provider 290 may be adapted to receive circuit selection information 292 from a circuit selection information input 294 and to provide a circuit selection signal 296 to the circuit 210 and to the bidirectional switchable interface 220. Moreover, the circuit selection information 292 may be routed to a circuit selection information output 298. The circuit selection information input 294 can, for example, be arranged on the same main surface 262 of the chip 260 as the first external connection 230 and the third external connection 250. Furthermore, the circuit selection information output 298 may be arranged on the same main surface 264 of the chip 260 as the second external connection 240. The circuit selection information output 298 may further be provided geometrically opposite the circuit selection information input 294, such that the circuit selection information is routed from one chip to an adjacent chip if two or more chips are stacked.

The circuit selection provider 290 may be adapted to provide the circuit selection signal 296 on the basis of a comparison between the circuit selection information 292 and the address information 272. Thus, the circuit selection signal 296 may be provided to indicate that the circuit 210 is selected if the circuit selection information 292 is identical to the address information 272 (or in a predetermined relationship with the address information 272). Thus, a mechanism may be provided to indicate whether the circuit 210 is selected. Moreover, the circuit selection information 292 may also be provided to the bidirectional switchable interface 220 to determine which signal path is to be routed. For example, the bidirectional switchable interface 220 may be configured to allow for a data connection between the first external connection 230 and the circuit 210 if the circuit 210 is selected. Optionally, the bidirectional switchable interface 220 may interrupt a data connection between the first external connection 230 and the circuit 210 if the circuit 210 is not selected (i.e., when the circuit selection signal 296 is inactive). Moreover, in the master mode of operation, the bidirectional switchable interface 220 may allow for a data connection between the first external connection 230 and the second external connection 240 if the circuit selection signal 296 indicates that the circuit 210 is not selected. Optionally, the bidirectional switchable interface 220 may interrupt the data connection between the first external connection 230 and the second external connection 240 if the circuit 210 is selected. In other words, in the master mode of operation, the bidirectional switchable interface 220 may provide the following functionality:

If the circuit 210 is selected, the data connection is provided between the first external connection 230 and the circuit 210, and the data connection between the first external connection 230 and the second external connection 240 is interrupted; if the circuit 210 is not selected, the bidirectional switchable interface 220 may provide a data connection between the first external connection 230 and the second external connection 240, and the data connection between the first external connection 230 and the circuit 210 may optionally be interrupted.

In the slave mode of operation, the bidirectional switchable interface 220 may provide the following functionality:

If the circuit 210 is selected, the data connection between the third external connection 250 and the circuit 210 is provided, and the data connection between the third external connection 250 and the second external connection 240 may optionally be interrupted; if the circuit 210 is not selected, the bidirectional switchable interface 220 may allow for a data connection between the third external connection 250 and the second external connection 240, and the data connection between the third external connection 250 and the circuit 210 may optionally be interrupted; and the first external connection 230 may be deactivated.

Thus, in some embodiments of the invention, power consumption can be reduced by avoiding maintenance of unnecessary connections.

In the following, a chip stack will be described.

Figure 3:
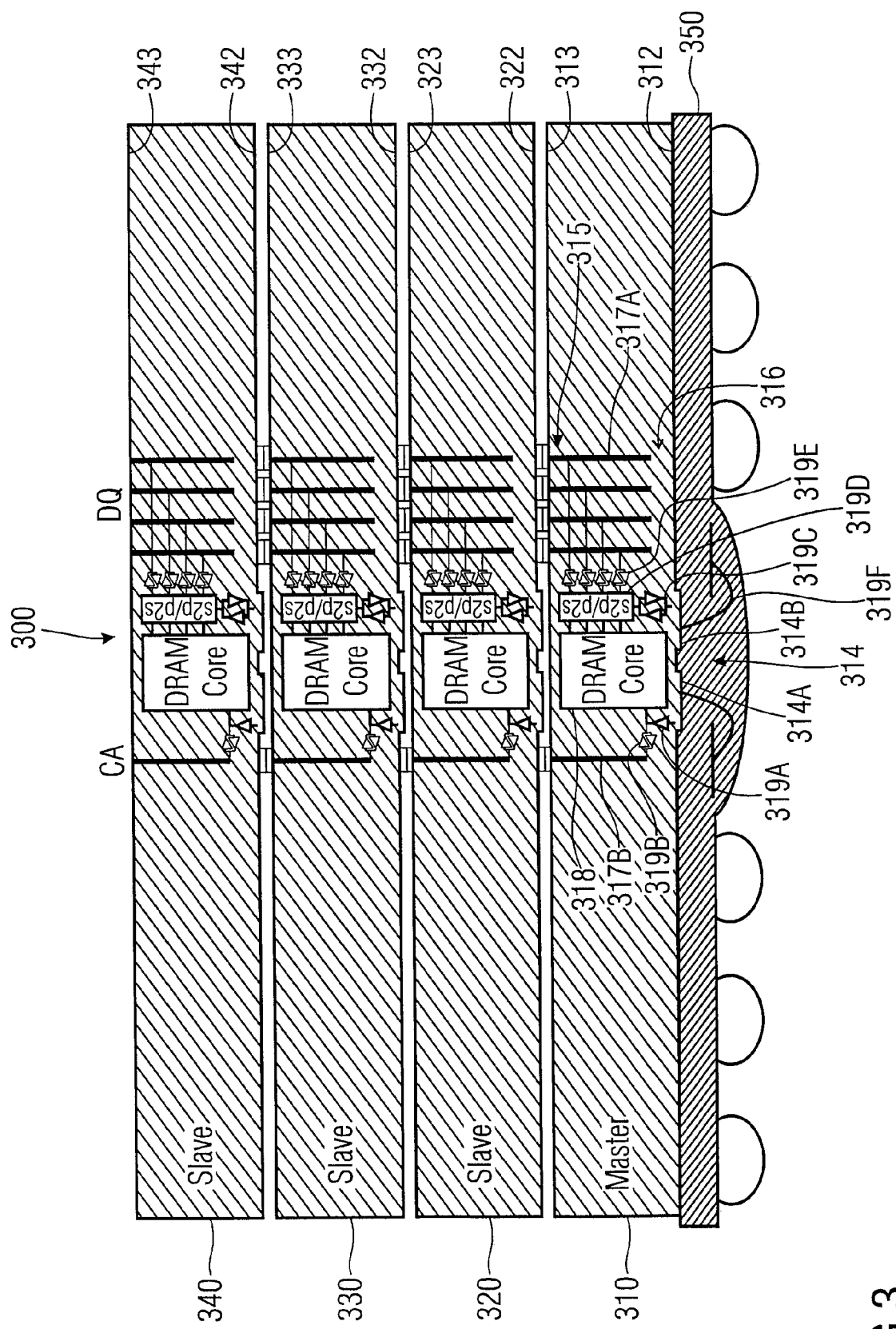
FIG. 3 shows a schematic diagram of a chip stack according to an embodiment of the invention.

FIG. 3 shows a schematic representation of a chip stack according to an embodiment of the present invention. The chip stack of FIG. 3 is designated in its entirety with 300. The chip stack 300 comprises a plurality of chips 310, 320, 330, 340. The chips 310, 320, 330, 340 forming the chip stack 300 may optionally be attached to a substrate 350, for example, a printed circuit board or any other type of substrate. Moreover, the chips 310, 320, 330, 340 are arranged such that some signals are routed from one chip to another chip via chip-to-chip connections.

Each of the chips 310, 320, 330, 340 comprises a first surface 312, 322, 332, 342 (e.g., a lower surface) and a second surface 313, 323, 333, 343 (e.g., an upper surface).

Each of the chips 310, 320, 330, 340 (or at least two of the chips) comprises a corresponding first connection 314. The first connection 314 comprises, for example, a first bond pad 314a for a column address signal and a second bond pad 314b for a data signal. For the sake of clarity, it should be noted that in the graphical representation of FIG. 3, only the respective bond pads for the first chip 310 are designated with a reference numeral. However, the other chips 320, 330, 340 may also comprise bond pads corresponding to the bond pads 314a, 314b of the first connection 314, as can be seen from FIG. 3. Moreover, the chips comprise a second connection 315 and a third connection 316. The third connection 316 is located on the first surface 312 of the corresponding chip 310, and the second connection 315 is located on the second surface 313 of the corresponding chip 310. For the sake of clarity, it should be noted that each of the chips 320, 330, 340, in an embodiment, comprises a corresponding second connection and a corresponding third connection, which have not been designated in the graphical representation of FIG. 3.

The second connection 315 comprises a plurality of data lines DQ, which are routed to the second surface 313 of the respective chip 310. At least one column address line CA is routed to the second surface 313 of the respective chip 310.

The third connection 316 comprises a plurality of data lines DQ routed to the first surface 312 of the respective chip 310, and at least one column address line CA routed to the first surface 312 of the respective chip 310. An exemplary data line is designated with 317a, and an exemplary column address line is designated with 317b. In an embodiment, the second connection 315 and the third connection 316 are connected by means of a through-silicon wire. In other words, in an embodiment, there is a direct electrical connection between the second connection 315 and the third connection 316. In other words, electrical contacts at the first surface 312 of the respective chip 310 are directly electrically connected (without any intermediate active circuitry) to corresponding contacts on the second surface 313 of the respective chip 310. Thus, at least some of the signals are routed one-to-one from the first surface 312 of the respective chip 310 to the second surface 313 of the respective chip 310. In other words, in an embodiment, a chip is configured to route signals present at the first surface 312 directly to the second surface 313, such that the signal can be routed through a plurality of chips if the chips are stacked.

Each of the chips 310, 320, 330, 340 (or at least two of the chips) comprises a corresponding dynamic random access memory core (DRAM core), which is configured to store data according to a dynamic random access memory principle, which is well known to a person skilled in the art. A first (possibly uni-directional) buffer 319a is connected between the first bond pad 314a of the first connection 314 and a column address input of the DRAM core 318. Moreover, a second (possibly bidirectional) buffer 319b is connected between the output of the first buffer 319a and the column address line 317. Consequently, the second buffer 319b is also connected between the column address line 317b and the column address input of the DRAM core 318. Consequently, the first buffer 319a and the second buffer 319b can be seen as a bidirectional switchable interface, which is connected between the first bond pad 314a of the first connection 314, the column address input of the DRAM core 318 and the column address line 317b. Such a bidirectional interface allows the routing of a column address signal from the first contact element 314a to a column address contact of the second connection 315, to route a column address signal from the first connection 314 to the column address input of the DRAM core 318, and to route a signal from a column address contact of the third connection 316 to the column address input of the DRAM core 318. Moreover, said bidirectional interface allows an exchange of column address information from a column address contact of the third connection 316 to a column address contact of the second connection 315.

Consequently, it should be noted that the bidirectional interface comprising the buffers 319a, 319b could be operated in a plurality of different conditions, thus allowing for a wide variety of signal paths.

Moreover, it should be noted that the second buffer 319b (also designated as a second buffer circuit) may, for example, comprise at least one bidirectional buffer element or a plurality of unidirectional buffer elements.

Each of the chips 310, 320, 330, 340 (or at least two of said chips) comprises a bidirectional data buffer 319c, a serial-to-parallel/parallel-to-serial converter 319d, and a plurality of bidirectional data line buffers 319e. The bidirectional data buffer 319c is circuited between the second bond pad 314b and the serial-to-parallel/parallel-to-serial converter 319d. The serial-to-parallel/parallel-to-serial converter 319d is connected to a data port of the DRAM core 318. Moreover, the serial-to-parallel/parallel-to-serial converter 319d is also coupled to the data lines 317a via the bidirectional data line buffers 319e. Thus, a plurality of different data flows can be implemented. For example, data can be provided by the first bond pad 314a in a serial form, buffered by the bidirectional data buffer 319c, converted into a parallel form by the serial-to-parallel/parallel-to-serial converter 319d, and provided to the data port of the DRAM core 318. Alternatively (or additionally), data may be provided in a serial form to the second bond pad 314b, forwarded by the bidirectional data buffer 319c to the serial-to-parallel/parallel-to-serial converter 319d, converted into a parallel form and forwarded to the data lines by the bidirectional data line buffers 319e. In this case, the data input by the second bond pad 314b may be available at the data contacts of the second connection 315 and may optionally also be available at data contacts of the third connection 316.

Moreover, if data are present at data contacts of the third connection 316, these data may be routed via the bidirectional drivers to the data port of the DRAM core 318. In another operational state, data which are present at data contacts of the second connection 315 may be routed to the serial-to-parallel/parallel-to-serial converter 319d via the bidirectional data line buffers 319e, converted into a serial data stream by the serial-to-parallel/parallel-to-serial converter 319d and may further be forwarded via the bidirectional data buffer 319c to the second bond pad 314b. In an alternative operation state, data which are present at data contacts of the second connection 315 may be forwarded to data contacts of the third connection 316. Conversely, data present at data contacts of the third connection 316 may be forwarded to data contacts of the second connection 315.

It should be noted that in the chip stack of FIG. 3, one device 310 is configured to be operated in a master mode of operation. The other devices for chips 320, 330, 340 are configured to operate in a slave mode of operation. It should be noted here that in an embodiment, the chip 310 attached directly (without another chip in between) to the substrate 350 is operated in the master mode of operation, while the other chips, which are not directly attached to the substrate 350, but which are stacked on top of the first chip 310, are operated in their slave mode of operation. Moreover, connections are formed between the bond pads 314a, 314b and pads of the substrate 350, for example, by making use of bond wires 319f. In contrast, respective contacts of the slave chips 320, 330, 340 are unconnected or open, as can be seen from FIG. 3. Thus, the slave chips 320, 330, 340 receive the column address information and the data information via the master chip 310. For example, data to be received by the slave chip 330 are provided to the master chip 310 via the second bond pad 314b. The data are routed via the bidirectional data buffer 319c and converted into a parallel data format via the serial-to-parallel/parallel-to-serial converter 319d. The data are further routed via the bidirectional data line buffers 319e to the data lines of the master chip 310. Moreover, said data are routed to the first slave chip 320, via the second connection 315 of the master chip 310 and to a third connection of the first slave chip 320, which is in electrical contact with the data contacts of the second connection 315 of the master chip 310. As the first slave chip 320 is not the intended recipient of the data, the data are forwarded through the first slave chip 320 to data contacts of the second connection 315 of the first slave chip 320, which is arranged at the second main surface 323 of the first slave chip 320. Further, the data are routed to the third connection 316 of the second slave chip 330, which is located at the first surface 332 of the second slave chip 330. Moreover, said data are routed via the bidirectional data line buffers 319e of the second slave chip 330 to a data port of the DRAM core 318 of the second slave chip 330. This routing is enabled, as it is known that the first chip 310, which is in direct electrical contact with the substrate 350, is a master chip, and as it is further known that the second chip 320 and the third chip 330 are slave chips. Moreover, the fact that the data are intended for the second slave chip 320 may be taken into consideration for the routing in one embodiment of the invention.

Moreover, it should be noted that the substrate 350 may comprise contacts (e.g., solder bumps) for providing a connection between the substrate 350 and another substrate (e.g., a printed circuit board carrying the substrate 350). In addition, the substrate 350 may comprise lateral connections, e.g., printed lines, which provide a connection between the solder bumps and pads from which the bond wires are routed to the bond pads 314a, 314b.

In addition, it should be noted that the contacts of the slave chips 320, 330, 340, which are equivalent to the bond pads 314a, 314b of the master chip 310, may be unconnected, may be floating or may be in such contact with an adjacent chip that a fixed potential (which is, for example, not dependent on data or addresses) is applied to said contacts.

Figure 4A:
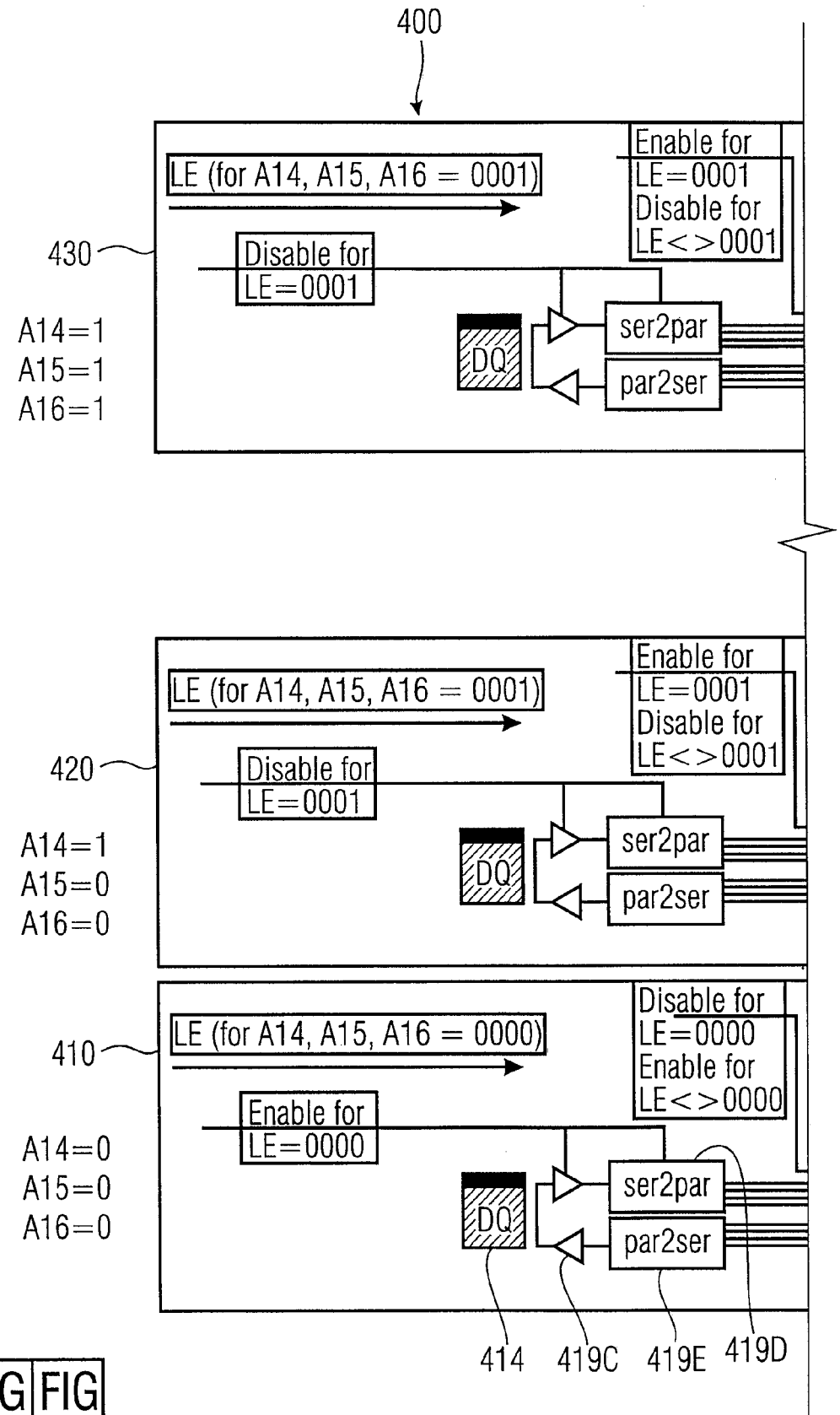
FIG. 4 shows a block schematic diagram of a chip stack according to another embodiment of the invention.
Figure 4B:
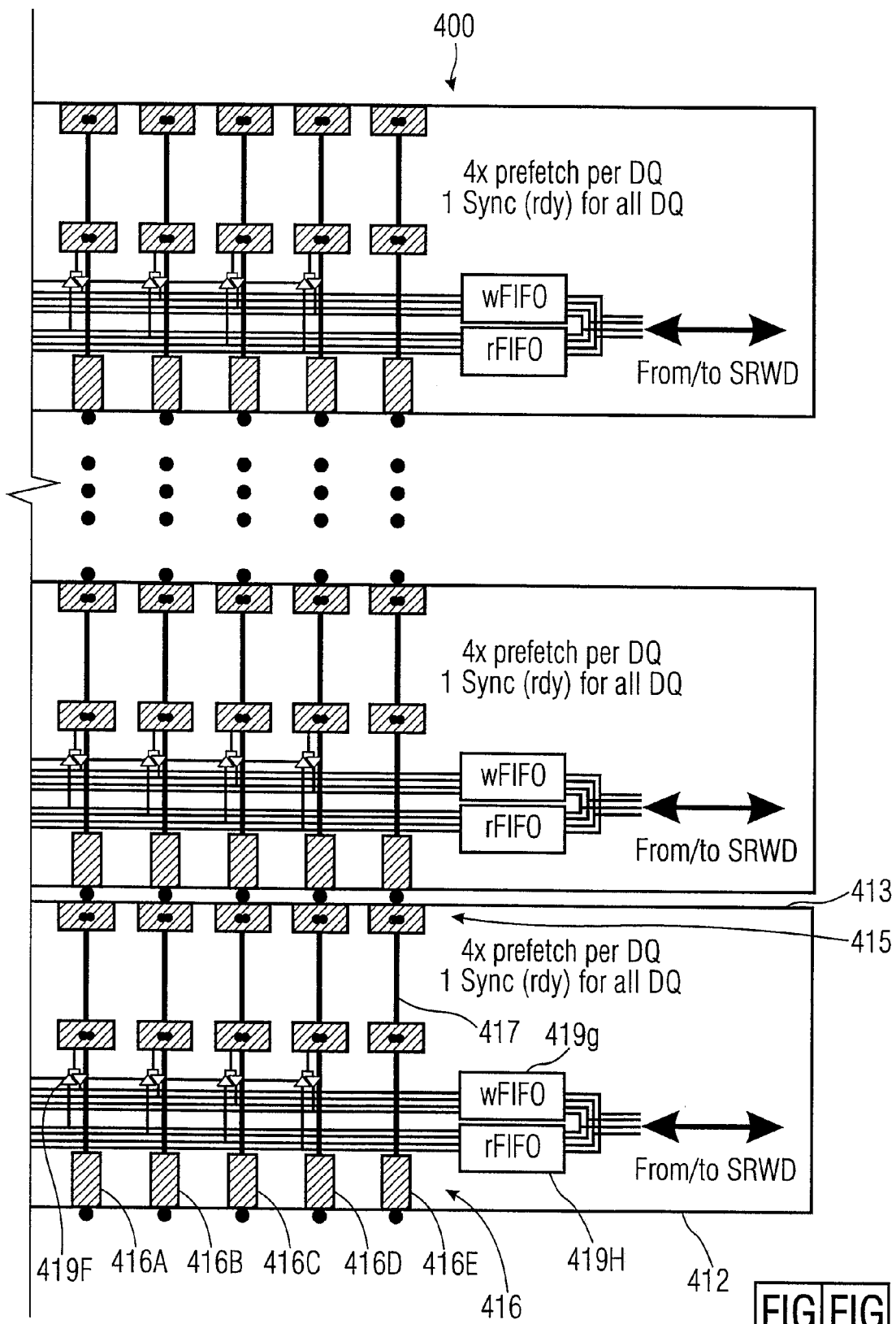

FIG. 4 shows a graphical representation of a chip stack according to an embodiment of the invention. The chip stack of FIG. 4 is designated in its entirety with 400. The chip stack 400 comprises a first chip 410, a second chip 420, and a third chip 430. The chips may, for example, comprise identical hardware, but one chip may serve as a master chip, and other chips may serve as slave chips, as has been described with reference to the chip stack 300. In the following, it will be assumed that all the chips are identical in hardware. Thus, only the first chip 410 will be described.

The first chip 410 comprises a first main surface 412 and a second main surface 413, which is opposite to the first main surface 412. The first chip 410 comprises a first connection 414, which may, for example, be a bond pad for a data signal DQ. Moreover, a second connection 415 comprising a plurality of contacts for a plurality of parallel data lines is present at the second main surface 413 of the chip 410. In addition, a third connection 416 comprising a plurality of contacts for a plurality of parallel data signals is present at the first main surface 412. The contacts are designated with 416a to 416e. Furthermore, chip 410 comprises a circuit (e.g., a DRAM core, a processor or any other data-handling or data-transport circuit), which is not shown here. However, a bidirectional buffer 419c is connected to the first connection 414. Additionally, the chip 410 comprises a serial-to-parallel converter 419d and a parallel-to-serial converter 419e. An input of the serial-to-parallel converter 419d is connected to the first connection 414 via an input buffer of the bidirectional buffer 419c, and parallel output lines of the serial-to-parallel buffer 419d are coupled to data lines 417 via a plurality of corresponding (e.g., bidirectional) buffers 419f. In addition, the parallel output lines of the serial-to-parallel converter 419d are also connected to a write first-in/first-out memory 419g. An output of the write first-in/first-out memory 419g is connected to the circuit, which may, for example, be a memory circuit. Furthermore, the input of the parallel-to-serial converter 419e are coupled to the data lines 417 via corresponding (e.g., bidirectional) buffers 419f. In addition, an input of the parallel-to-serial converter 419e is coupled to an output of a read first-in/first-out memory 419h. An input of the read first-in/first-out memory 419h is coupled to the circuit, for example, to the memory circuit.

It should be noted here that a corresponding address is associated to each of the chips 410, 420, 430. The address may be written by an address provider, which has been described above. For example, an address "0000" is associated with the first chip 410 and an address "0001" is associated with the second chip 420. Moreover, the first chip 410 may comprise some logic, which is adapted to recognize as to whether a predetermined address (e.g., the address "0000") is associated with the first chip 410 or not. If it is found that the predetermined address is associated to the first chip 410, the bidirectional buffer 419c (or at least an input buffer thereof) and the serial-to-parallel/parallel-to-serial converter 419d, 419e (or at least the serial-to-parallel converter 419d) are enabled. In contrast, if it is determined that the address associated with the first chip is different from the predetermined address, the bidirectional 419c (or at least the input buffer thereof) and the serial-to-parallel/parallel-to-serial converter 419d, 419e (or at least the serial-to-parallel converter thereof) may be disabled. Moreover, for the master chip 410, the bidirectional buffer 419f may be enabled or disabled in dependence on whether an address is to be accessed, which is associated with the master chip 410. For example, if an address is to be accessed, which is associated with the master chip 410 (e.g., which is associated to a memory element of the master chip), a bidirectional buffer 419f may be disabled. If, in contrast, an address is to be accessed, which is not associated to the first chip or master chip 410, then the (e.g., bidirectional) buffers 419f are activated. By activating and deactivating the buffers, energy can be saved, as it is not necessary to forward any data to the slave chips 420, 430 if only access to a circuit on the master chip 410 is required.

To the contrary, a chip, which is operated in a slave mode of operation (e.g. the slave chip 420) may comprise a logic, which is adapted to activate the bidirectional buffer 419f between the data lines and the inputs of the write first-in/first-out memory 419h and/or the read first-in/first-out memory only if an address is to be accessed, which is associated to the slave chip. Consequently, a load to the data line, which is routed through the slave chip, can be minimized in the case that the slave chip is not to be accessed.

In other words, the bidirectional buffer 419f coupling the first connection 414 (via, for example, the bidirectional buffer and the serial-to-parallel/parallel-to-serial converter) and a circuit (e.g., via a write first-in/first-out memory or via a read first-in/first-out memory) to the data line 417 may be controlled by a control logic, which determines the state of the bidirectional buffer in dependence on the mode of operation of the respective chip and the address to be accessed during an access operation.

Further details will subsequently be described with respect to FIG. 5.

Figure 5A:
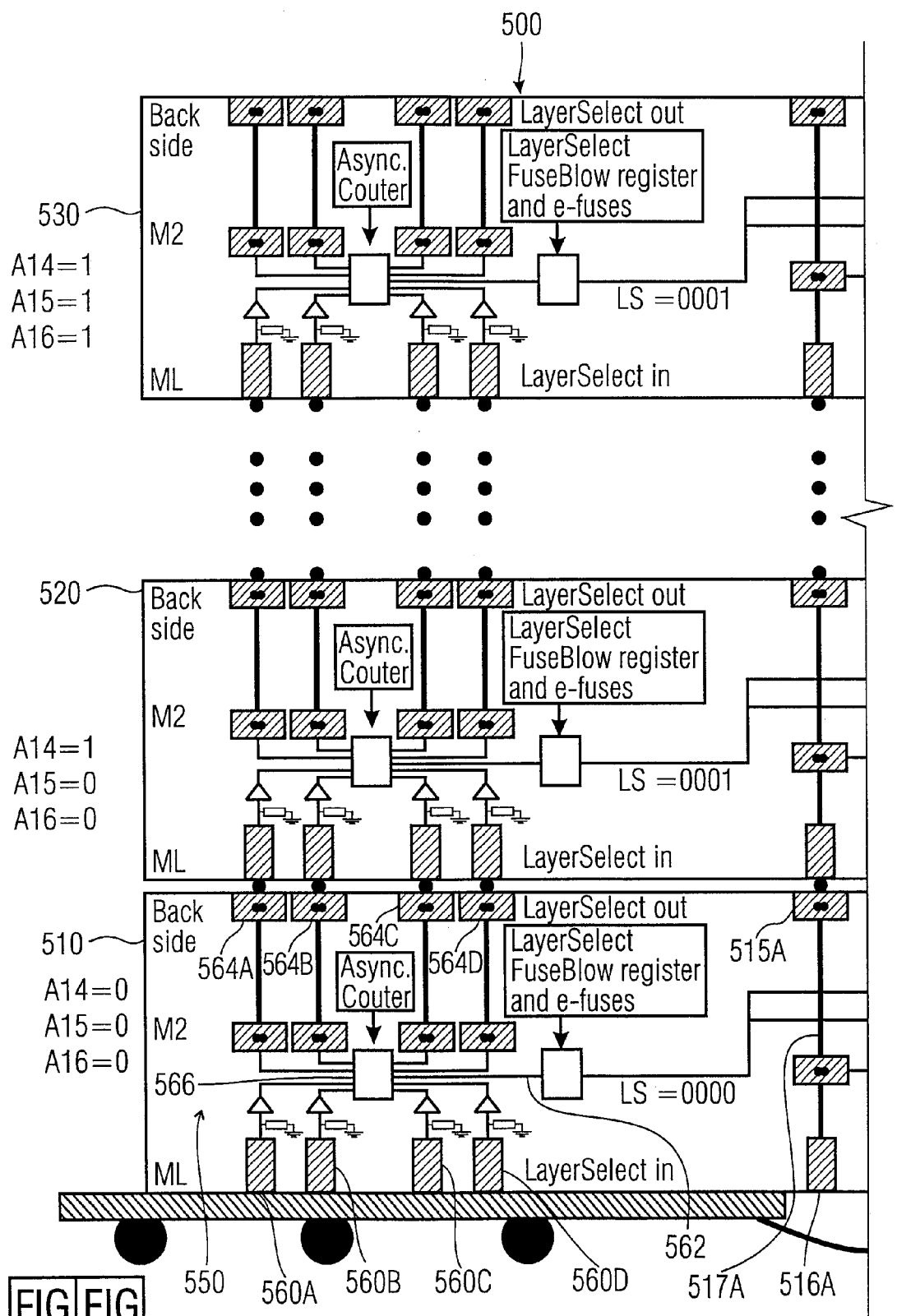
FIG. 5 shows a block schematic diagram of a chip stack according to another embodiment of the invention.
Figure 5B:
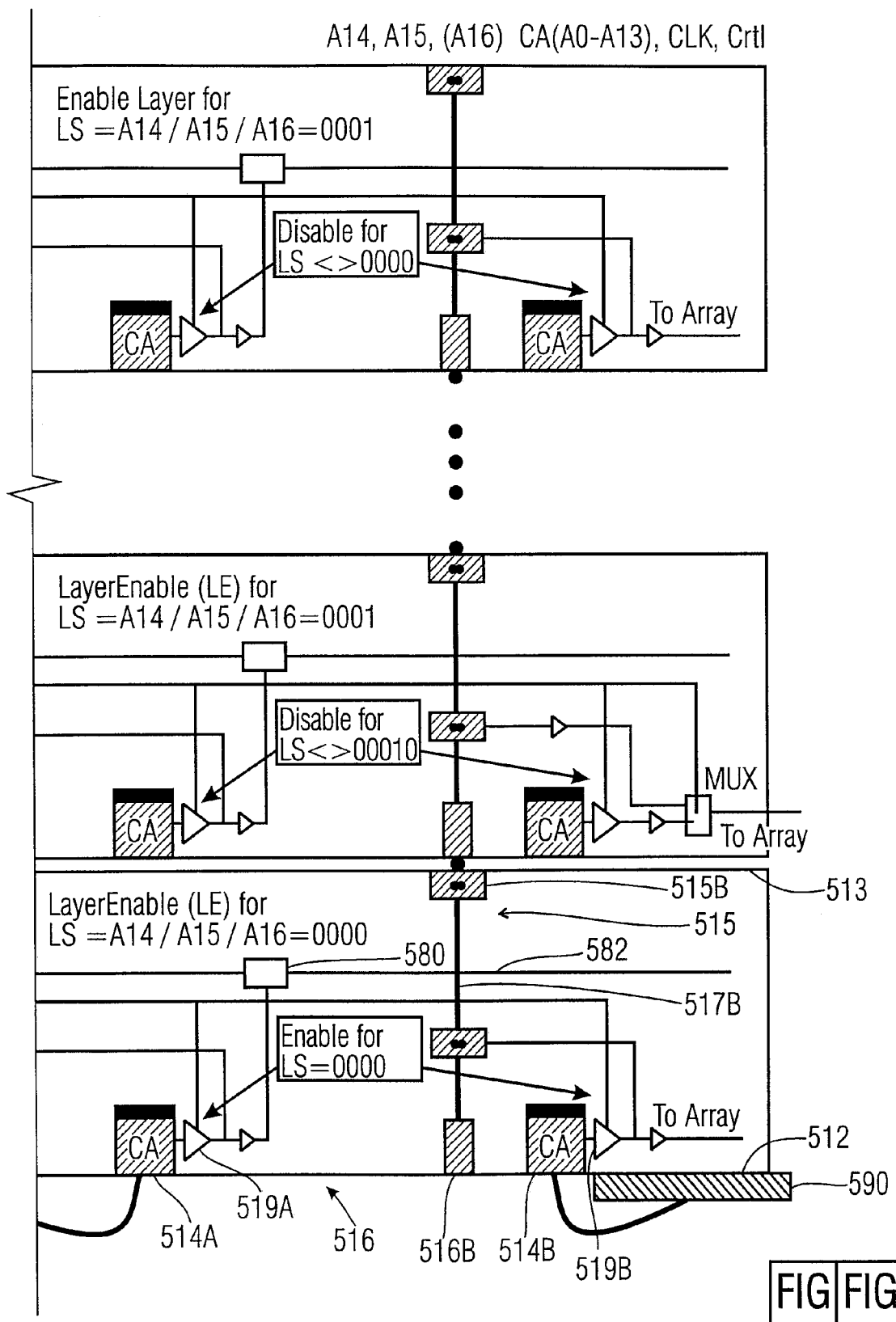

FIG. 5 shows a graphical representation of a chip stack, according to an embodiment of the present invention. The chip stack of FIG. 5 is designated in its entirety with 500 and may, for example, be used to implement a single rank 8 Gb memory.

The chip stack 500 comprises, for example, a first chip or a master chip 510, a second chip 520, and a third chip 530. The first chip 510 of the chip stack 500 may, for example, be identical to the first chip 410 of the chip stack 400. The second chip 520 of the chip stack 500 may also be identical to the second chip 420 of the chip stack 400, and the third chip 530 of the chip stack 500 may be identical to the third chip 430 of the chip stack 400. However, while the schematic representation of FIG. 4 is focused on data lines, the schematic representation of FIG. 5 is focused on address signals, command address signals and control signals. In the following, the first chip 510 will be described in more detail, while it should be noted that the hardware structure of the second chip 520 and of the third chip 530 may be identical to the first chip in some embodiments.

The first chip 510 comprises a first main surface 512, which may, for example, be a surface of the chip 510 on which a metallization is located. In other words, the first main surface 512 may, for example, be a surface of a chip or wafer on which the active devices are formed and connected, making use of the metallization. Moreover, the first chip 510 comprises a second main surface 513, which may, for example, be a backside of a wafer or chip (e.g., a main surface of the chip on which no active circuitry is placed).

The first chip 510 comprises a first command address contact 514a and a second command address contact 514b. The first command address contact 514a and the second command address contact 514b may be considered to be part of a first connection, and are both located at the first main surface 512 of the chip 510. The first chip 510, however, comprises a second connection 515 comprising a corresponding first command address contact 515a and a corresponding second command address contact 515b. The first command address contact 515a and the second command address contact 515b of the second connection are both arranged on the second surface 513 of the chip 510. The chip 510 further comprises a third connection 516, the third connection 516 comprising, for example, a corresponding first command address contact 516a and a corresponding second command address contact 516b. The contact 515a is connected with the contact 516a via a first command address line 517a, and the contact 515b is connected to the contact 516b via a second command address line 517b. Moreover, a buffer or driver 519a is circuited between the contact 514a and the first command address line 517a. Apart from this, a driver or buffer 519b is circuited between the contact 514b and the second command address line 517b. Furthermore, output signals of the buffers 519a, 519b may also be provided to a circuit for further processing, for example to a memory array. Additionally, the buffers 519a, 519b may be activated and deactivated in dependence on address information associated with the chip 510. If an address information associated with the chip 510 indicates that the chip 510 is operated in a master mode of operation, the buffers 519a, 519b may, for example, be activated, such that a signal at the output of the buffers 519a, 519b, which may be provided both to the command address lines 517a, 517b and to the circuit (e.g., to the memory array) are determined by the buffers 519a, 519b. Consequently, the level of the signals at the outputs of the buffers 519a, 519b is determined by the signals present at the contacts 514a, 514b. However, if the address information associated to the chip 510 indicates that the chip is operated in a slave mode of operation, the buffers 519a, 519b may, for example, be deactivated. In this case, outputs of the buffers 519a, 519b may, for example, be in a high impedance state. In this case, signals at the outputs of the buffers 519a, 519b may be dominated by the signals present on the command address lines 517a, 517b, such that the signals present on the command address lines 517a, 517b are forwarded to the circuit (e.g., to the memory array).

If the chip 510 is operated in the slave mode of operation, the command address signals may be input via the contacts 516a, 516b, and may be provided both to the contacts 515a, 515b of the second connection 515 and the circuit on the chip 510 (e.g., to the memory array).

Additionally, the chip 510 may comprise an address provider circuit, which may be adapted to provide an address, which is associated with the chip 510. As an example, an address provider circuit is designated with 550. The address provider circuit 550 comprises, for example, a plurality of address inputs, which may be formed by contacts 560a to 560d, wherein the contacts 560a to 560d may be located at the first surface 512 of the chip 510. The address provider circuit 550 may be configured to receive encoded address information via the contacts 560a to 560d and to provide address information 562 on the basis of the information provided via the contacts 560a to 560d. Moreover, the address provider 550 may optionally comprise an address output comprising a plurality of contacts 564a to 564d. The address provider 550 may further comprise a (e.g., combinatorial) logic circuit 566, which is adapted to provide the address output signals for the contacts 564a to 564d on the basis of the address input signals from the contacts 560a to 560d. Thus, the (e.g., combinatorial) circuit 566 may be adapted to provide a different encoded address value to the contacts 564a to 564d when compared to the address received via the contacts 560a to 560d. Moreover, the contacts 564a to 564d may be adapted to be in electrical contact with an address input contact of a second chip 520, which is stacked on the first chip 510.

In addition, the chip 510 may optionally comprise a nonvolatile register to which the address information 562 may be stored. However, the use of such a register is not necessary.

Nevertheless, the address provided by the address provider 550 may be used for two purposes. Firstly, the address provided by the address provider 550 may be used to decide whether or not the chip 510 is in a master mode of operation. Only if the address provided by the address provider 550 takes a predetermined value, may the chip 510 be placed in the master mode of operation. Otherwise, the chip 510 may be placed in the slave mode of operation. Apart from this, the address provided by the address provider 550 may also be used to decide whether the chip 510 is selected by the command address information. For this case, one or more bits of the command address information may be compared with the address information 562, and a chip select signal may be provided on the basis of a comparison between the address information 562 and the address information provided by one or more bits of the command address information.

A comparison between the address information 562 and the address information provided by at least one bit of the command address information may, for example, be performed in the comparator 580. The resulting chip select signal is designated with 582. Moreover, bits of the command address information, which are not used for creating a chip select signal (also designated as a layer enable signal) may also be fed directly to the circuit of the chip 510 (e.g., to a memory array on the chip 510).

Taking reference to the configuration of FIG. 5, the first chip 510 is placed in the master mode of operation, as its address provider 550 provides an address of "0000", which has been defined to be the master chip address. The address of "0000" may, for example, be caused by the fact that the contacts 560a to 560d are left open (are not in contact with any electrical connections of the substrate 590, to which the chip 510 is attached), wherein address inputs of the address provider 550 are, nevertheless, brought to a predetermined state, e.g., by the means of pull-up resistors or pull-down resistors. Moreover, the address provider 550 of the master chip 510 provides a different address, for example an address of "0001", to the corresponding output contacts 564a to 564d. An address provider of the second chip 550 receives said information (e.g., via corresponding input contacts), such that the address of the second chip 520 is set to "0001". Thus, the second chip 520 is placed in the slave mode of operation.

Figure 6A:
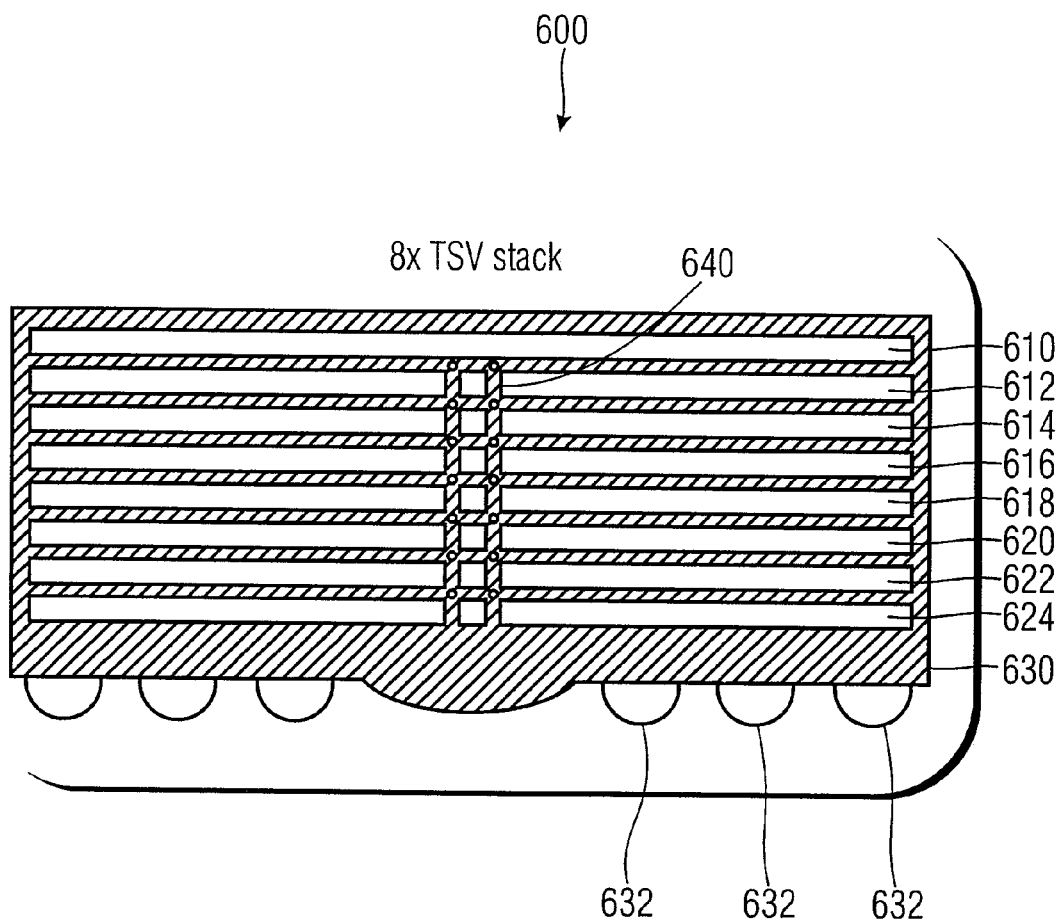
FIG. 6a shows a graphical representation of a through-silicon wire (TSV) stack.

FIG. 6a shows a graphical representation of an 8× through-silicon via (TSV) stack. The through-silicon via stack of FIG. 6a is designated in its entirety with 600. The through-silicon via stack 600 comprises 8 chips 610, 612, 614, 616, 618, 620, 622, 624. The chips 610 to 624 are stacked on top of each other, such that a stack of chips is formed. In an embodiment of the invention, the chips are directly stacked on top of each other, such that there is no solid spacer layer in between two chips. However, other configurations are possible. Moreover, the stack of chips is attached to a substrate 630, which may, for example, provide a connection between a (lowermost) chip 624 attached to the substrate 630 and solder bumps 632 on the substrate 630. In addition, signals are routed through the stack of chips, making use of through-silicon vias 640. With regard to the chips 610 to 624, the chip stack 600 may comprise a plurality of chips, which have been described with respect to FIGS. 2, 3, 4 and 5. Moreover, the through-silicon vias 640 may, for example, replace or implement the data lines 317a and/or the command address lines 317b. Alternatively, the through-silicon wires may, for example, replace or implement the data lines 417 and/or the common address lines 517a, 517b.

Figure 6B:
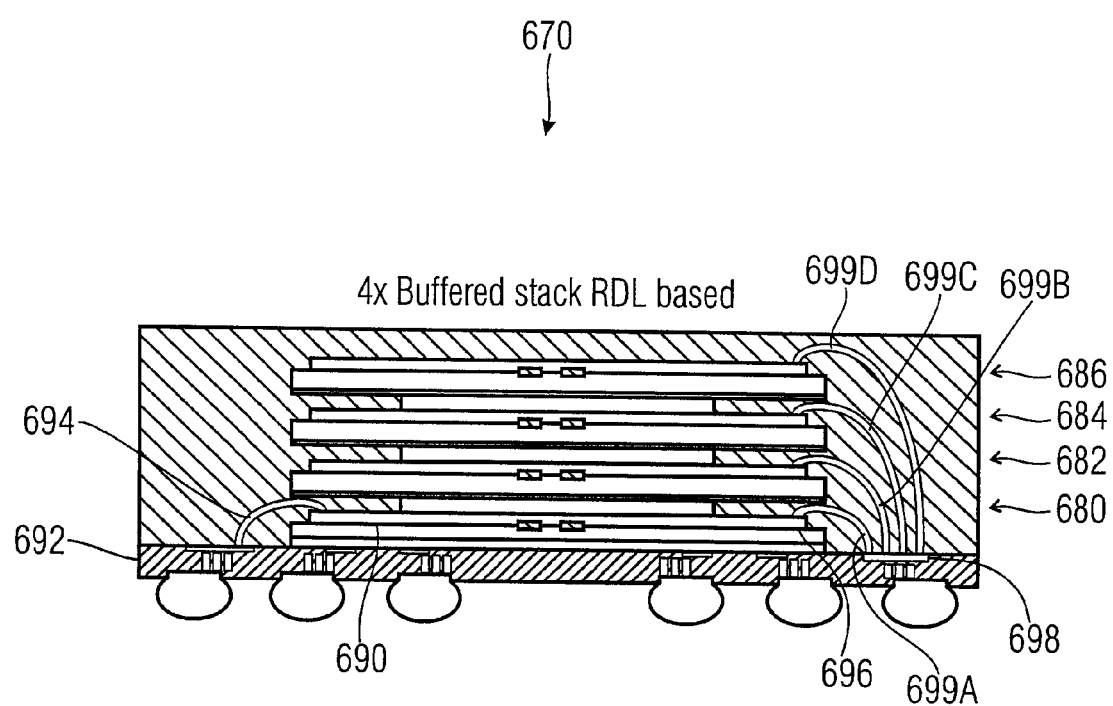
FIG. 6b shows a graphical representation of a redistribution layer based buffered stack.

FIG. 6b shows a graphical representation of a 4× buffered redistribution layer (RDL) based stack. The chip stack of FIG. 6b is designated in its entirety with 670 and comprises four chips 680, 682, 684, 686 stacked on top of each other. The first chip 680 comprises a first connection 690, which is connected to a carrier substrate 692 via a bond wire 694. Moreover, the first chip 680 comprises a second connection 696, which is connected to a pad 698 via a bond wire 699a. Moreover, connections of further chips 682, 684, 686 are connected to the connection 696 of the first chip 680 via further bond wires 699b, 699c, 699d. Thus, connections of the chips 680 to 686 are coupled via the pad 698 and bond wires 699a to 699d. In an embodiment, the first chip 680 may be configured to communicate with an external environment (e.g., with devices outside the chip stack) via the first connection 690, and may forward the data to the other chips 682, 684, 686 of the chip stack via the second connection 696, the pad 698 and the bond wires 699a to 699d. Thus, the first chip may act as a buffer device.

Figure 7:
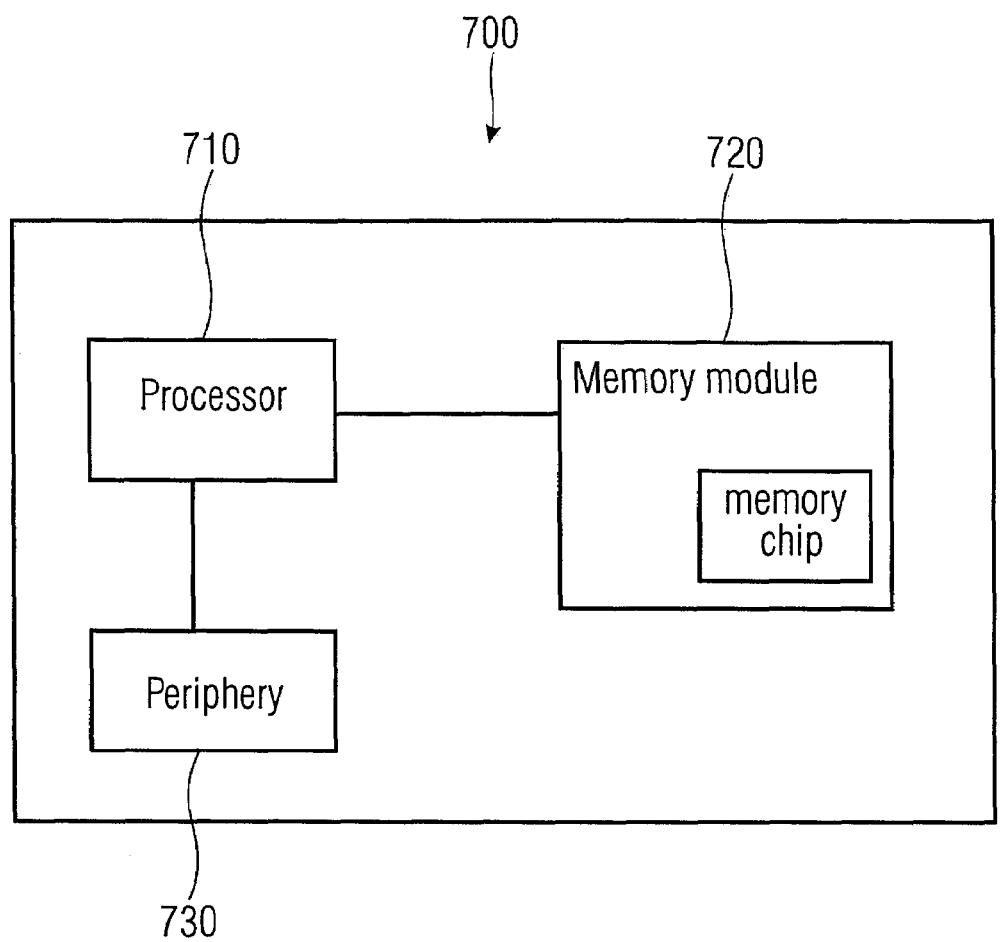
FIG. 7 shows a block schematic diagram of a data processing system according to an embodiment of the invention.

In the following, a data processing system will be described. For this purpose, FIG. 7 shows a block schematic diagram of a data processing system according to an embodiment of the present invention. The data processing system of FIG. 7 is designated in its entirety with 700. The data processing system 700 comprises a processor 710 and a memory module 720 coupled to the processor 710. Moreover, the data processing system 700 comprises at least one peripheral component 730, which is coupled to the processor 710 and configured to provide at least an input functionality or output functionality. The processor 710 may, for example, comprise any of the known microprocessors, for example an Intel Pentium series processor or any predecessor or successor processor. However, processors of other manufacturers, which are well known to a man skilled in the art, may also serve as the processor 710.

The peripheral component 730 may comprise any input/output device known to the man skilled in the art, for example, a keyboard interface, a mouse interface, a video interface, a network communication interface, a point-to-point communication interface, a mass storage interface, or the like. Moreover, a memory controller may optionally be circuited in between the processor 710 and the memory module 720.

Additionally, the memory module 720 may, for example, be adapted to be connected to the processor 710 via a fixed or a detachable connection. The memory module 720 may, for example, comprise one or more memory chips. The memory chips may, for example, comprise one of the chips shown in FIG. 2, 3, 4 or 5. The circuit mentioned above (e.g., the circuit 210, or the circuit mentioned with respect to the chip 410) may, for example, comprise a memory array, which takes over the memory functionality.

The processor 710 may, for example, be coupled to a memory chip or stack of memory chips on the memory module via an optional memory controller and via any optional circuitry on the memory module. However, a direct coupling between the processor and the memory chip or stack of memory chips may also be used. Thus, the above-described configuration allows the processor 710 to access data stored in a memory array of a memory chip or in a memory array of a stack of memory chips. Furthermore, when a stack of memory chips is used, the processor may be able to provide an information (e.g., an address information) indicating which memory chip out of the stack of memory chips should be used.

Moreover, the memory chips could be configured such that even a stack of memory modules may effectively behave like a single chip. In other words, with respect to the external environment, a stack of memory chips may, according to an embodiment of the invention, present electrical characteristics (e.g., an electrical load), which are identical to electrical characteristics of a single chip. Consequently, even when using a stack of chips, the memory module, an optional memory controller and/or the processor do not need to be adapted accordingly, but can remain in a configuration, which is normally used for a single chip memory.

To summarize the above, according to some embodiments, the present invention creates buffered/through-silicon via (TSV) stacking options. In addition, according to some further embodiments, the present invention creates hooks for standard DRAMs.

In some embodiments of the invention it is possible to place hooks in a DRAM to use an input/output circuitry (I/O) from one (master) DRAM and to connect other (slave) DRAMs internally. Some embodiments of the invention allow to provide a DRAM chip stack comprising a plurality of stacked individual chips, wherein a single input/output timing is present, irrespective of which individual chips is active. According to an embodiment of the present invention, such a chip may present only a single load on a data bus.

In other words, some embodiments of the invention allow the creation of a JEDEC conforming DRAM even on the basis of a stack of chips. A controller may see a standard "single die" component, which may, for example, be implemented as a single rank device. However, two rank devices, or four rank devices, may also be provided.

According to some embodiments, the present invention creates a stack of memory chips, wherein there is one master device (or a master chip) driving to the slave DRAMs (or slave chips). Thus, according to some embodiments of the present invention, a DRAM design can be provided that can be sold as a single ×8 device. An interface to a system (e.g., an interface between a memory chip and an external circuitry, like a memory module circuitry, a memory controller or a processor) may be a single load or a dual load according to some embodiments.

In some embodiments, each layer (e.g., each layer of a stack or each chip of a stack) may receive information on which most significant bit address bit to react. In order to achieve this, each layer may get a unique identification.

According to some embodiments, each "layer select in" is a pull-down (e.g., a pull-down resistor or a pull-down transistor). However, it is sufficient that some of the layer select inputs have respective pull-down elements. Moreover, each "layer select out" and may drive high. In an embodiment, only the lowest device (or a lowest chip) gets a "0000" and on its layer select (or on its layer select input) after power up. All the other devices (or at least some of the chips of the stack of chips) get, for example, a value of "1111". A device which has a value of "0000" knows that it is a master device.

In an embodiment, after assembly, on first power up, a test mode "layer select" is activated or initiated. After starting the test mode "layer select", a device may evaluate an input asynchronously. The device may be adapted to do nothing if the input is "1111". If the input is different from "1111", the device may be adapted to write the input asynchronously to a "fuse blow" register. For example, a value of "0000" may be written for a master device. Moreover, the devices (or chips) may be configured to add one and drive the result of the addition on the "layer select out". For example, the master device may drive the value "0001" on the layer select out. Once a master device drives "0001", the next device may realize asynchronously that the "layer select in" is different from "1111". Thus, the next device may write the value at the layer select in to a fuse blow register. For example, the next device may write a value of "0001" if it is the second layer. Moreover, the next device may add one and drive the result of the addition to the "layer select out". For example, the second device may drive the value of "0010" (e.g., in binary format) to the layer select out.

The above-described sequence may, for example, run asynchronously up to the last chip. The last chip has to stay with "1111", for example, if there are 16 chips.

In an embodiment, after a defined time, a test mode "layer set" may be initiated for all layers to blow all fuses according to the fuse-blow register.

It should be noted that according to some embodiments, a layer select process could be synchronous or asynchronous. The layer select process can be started by a test mode (TM) or during power-up. In some embodiments, a "layer select done" fuse bit may be used to indicate whether the layer select process has been completed. In an alternative embodiment, a layer select process can be done dynamically during power-up and the result of the layer select process may not be fixed by e-fuses in this case.

In some embodiments, the bottom device (e.g., the device operating in a master mode of operation) may comprise an additional functionality. For example, the master device may provide special test modes, e.g., deactivating other layers for test reasons. Moreover, the master device may, for example, start a layer definition process. For example, the master device may start a fuse or e-fuse blow for layer definition.

To summarize the above, some embodiments of the present invention allow for a particularly efficient implementation of a stack of memory chips, wherein all the memory chips may be identical, but may still be configured to operate in different functionalities. The master device may provide the functionality of a buffer device, thus, providing buffers or drivers for input signals and/or output signals. Consequently, according to some embodiments, even a stack of chips may electrically behave like a single chip.

In the above description, the term "memory circuit" may designate any type of memory circuit. For example, the term memory circuit may designate an individual memory cell. Alternatively, the term memory circuit may designate a DRAM circuit, or a SRAM circuit. For example, the term memory circuit may designate an array of memory cells. Also, the term memory circuit may designate an array of memory cells, together with a register and a decoder.

What is claimed is:

1. An integrated circuit being configured as a memory chip, the integrated circuit comprising:
   a first external connection;
   a second external connection;
   a third external connection;
   a memory circuit; and
   a first buffer between the first external connection and the memory circuit,
   wherein the integrated circuit is switchable between a master mode of operation, in which the first buffer between the first external connection and the memory circuit is activated and in which data is received via the first external connection and the received data is forwarded to another integrated circuit via the second external connection, and a slave mode of operation, in which the first buffer between the first external connection and the memory circuit is deactivated and in which data exchange with the memory circuit is performed via the third external connection, and
   wherein the second external connection is geometrically positioned opposite the third external connection on opposing main surfaces of the memory chip such that when two identical memory chips are stacked one on top of the other, the second external connection of one of the two memory chips is in electrical contact with the third external connection of the second one of the two memory chips.

2. The integrated circuit of claim 1, further comprising:
   a second buffer coupled between the second external connection and the memory circuit, and
   wherein the second buffer is coupled between the second external connection and the memory circuit.

3. The integrated circuit of claim 2, wherein the first buffer comprises a first port coupled to the first external connection and a second port coupled to the memory circuit,
   wherein the second buffer comprises a first port coupled to the second external connection and a second port coupled to the memory circuit, and
   wherein the second port of the first buffer is coupled to the second port of the second buffer.

4. The integrated circuit of claim 2, wherein, in the master mode of operation, the first and second buffers are configured to be active to exchange data between the first and second external connections.

5. The integrated circuit of claim 2, wherein, in the slave mode of operation, the first buffer is configured to be inactive, and the second buffer is configured to be active to exchange data between the second external connection and the memory circuit.

6. The integrated circuit of claim 2, wherein, in the master mode of operation, the integrated circuit is adapted to provide an effective electrical coupling between the first external connection and the second external connection depending on whether the memory circuit is selected for a data exchange.

7. The integrated circuit of claim 6, wherein, in the master mode of operation, the integrated circuit is adapted to provide the effective electrical coupling between the first external connection and the second external connection only if the memory circuit is not selected for data exchange.

8. The integrated circuit of claim 2, wherein, in the master mode of operation, the first buffer and the second buffer are configured to drive address data from the first external connection to the second external connection; and
    wherein, in the slave mode of operation, the second buffer is configured to drive received address data to the memory circuit.

9. The integrated circuit of claim 2, wherein in the master mode of operation, the first buffer and the second buffer are configured to drive write data from the first external connection to the second external connection, and to drive read data from the second external connection to the first external connection; and
    wherein in the slave mode of operation, the second buffer is configured to drive received write data to the memory circuit, and to drive read data from the memory circuit.

10. The integrated circuit of claim 9, wherein, in the master mode of operation, the first buffer is configured to drive write data from the first external connection to the memory circuit, and to drive read data from the memory circuit to the first external connection.

11. The integrated circuit of claim 1, further comprising an address provider configured to provide a chip address for the integrated circuit.

12. The integrated circuit of claim 2, wherein the first buffer comprises a serial-to-parallel converter configured to convert data between an external serial data transport format, and a parallel data transport format, and
    wherein the second external connection is configured to transfer data using the parallel data transport format.

13. The integrated circuit of claim 1, wherein the integrated circuit is configured to be set to the master mode of operation or to the slave mode of operation by bonding a bond wire to a mode-set bond pad.

14. The integrated circuit of claim 1, further comprising a circuit configured to receive a chip address signal and to set the integrated circuit into the master mode or the slave mode dependent from the received chip address signal.

15. The integrated circuit of claim 14, wherein the circuit comprises an address input for the chip address signal, wherein the integrated circuit is set into the master mode of operation, if the address input is left open.

16. The integrated circuit of claim 14, wherein the integrated circuit comprises an address output configured to provide a modified chip address signal on the basis of the received chip address signal, and
    wherein the modified chip address signal describes a different address when compared to the input chip address signal.

17. The integrated circuit of claim 1, further comprising a chip address provider, the integrated circuit being configured to allow access to the memory circuit dependent on a chip address provided by the chip address provider and a received address information.

18. The integrated circuit of claim 2,
    wherein the second buffer is also coupled between the third external connection and the memory circuit, and
    wherein in the slave mode of operation the second buffer is configured to drive address data from the third external connection to the memory circuit.

19. The integrated circuit of claim 18, wherein, in the slave mode of operation, the integrated circuit is configured to forward address data from the third external connection to the second external connection.

20. The integrated circuit of claim 2,
    wherein the second buffer is also coupled between the third external connection and the memory circuit, and
    wherein in the slave mode of operation the second buffer is configured to drive write data from the third external connection to the memory circuit, and to drive read data from the memory circuit to the third external connection.

21. The integrated circuit of claim 20, wherein, in the slave mode of operation, the integrated circuit is configured to forward read data from the second external connection to the third external connection, and to forward write data from the third external connection to the second external connection.

22. The integrated circuit of claim 20, wherein, in the slave mode of operation, the second buffer is configured to allow for a data exchange between the third external connection and the memory circuit only if the memory circuit is selected for a data exchange.

23. The integrated circuit of claim 1, wherein the second external connection and the third external connection are coupled via a direct electrical connection, via a through-chip via, or via a third buffer.

24. The integrated circuit of claim 18,
    wherein the second external connection comprises a plurality of individual connections forming a contact pattern,
    wherein the third external connection comprises a plurality of individual connections forming a contact pattern, and
    wherein the first external connection and the second external connection comprise mating contact patterns.

25. The integrated circuit of claim 18, wherein the integrated circuit comprises an address input configured to receive a chip address information for the integrated circuit,
    wherein the address input is arranged on the same main surface of the memory chip as the third external connection.

26. The integrated circuit of claim 25, wherein the integrated circuit comprises an address output configured to provide a modified chip address information on the basis of the chip address information received via the address input,
    wherein the modified chip address information describes a different address when compared to the received chip address information, and
    wherein the address output is arranged on the same main surface of the chip as the second external connection.

27. The integrated circuit of claim 26, wherein a contact pattern comprising the address input and the third external connection mates a contact pattern comprising the address output and the second external connection.

28. The integrated circuit of claim 1, wherein the integrated circuit is usable as a standalone chip.

29. A chip stack, comprising:
    a first integrated circuit, comprising
        a first external connection;
        a second external connection
        a third external connection;
        a memory circuit; and
        a first buffer between the first external connection and the memory circuit,
        wherein the first integrated circuit is configured as a first memory chip, and
        wherein the first integrated circuit is switchable between a master mode of operation, in which the first buffer is activated, and a slave mode of operation, in which the first buffer is deactivated; and
    a second integrated circuit, comprising
        a first external connection;
        a second external connection;
        a third external connection;
        a memory circuit; and a first buffer between the first external connection and the memory circuit, wherein the second integrated circuit is configured as a memory chip, wherein the second memory chip is switchable between a master mode of operation, in which the first buffer is activated, and a slave mode of operation, in which the first buffer is deactivated, wherein the first integrated circuit is configured to forward data from its first external connection to the second integrated circuit, if the first integrated circuit is in the master mode of operation, and wherein the second integrated circuit is configured to receive data forwarded by the first integrated circuit, if the second integrated circuit is in the slave mode of operation, and wherein the first and second memory chips are stacked one on top of the other such that the second external connection of the first memory chip is in electrical contact with the third external connection of the second memory chip.

30. The chip stack of claim 29, wherein the first integrated circuit comprises a second buffer coupled between the second external connection and the memory circuit, wherein, in the master mode of operation of the first memory chip, the first and second buffers of the first memory chip are configured to be active to exchange data between the first and second external connections of the first memory chip, wherein the second integrated circuit comprises a second buffer coupled between the second external connection and the memory circuit, and wherein, in the slave mode of operation of the second memory chip, the first buffer of the second memory chip is configured to be inactive and the second buffer of the second memory chip is configured to be active to exchange data between the second external connection of the first memory chip and the memory circuit of the second integrated circuit.

31. The chip stack of claim 29, wherein the first integrated circuit is configured to operate in the master mode of operation, and wherein the second integrated circuit is configured to operate in the slave mode of operation.

32. The chip stack of claim 29, wherein the first external connection of the second integrated circuit is unconnected.

33. The chip stack of claim 29, wherein the first external connection of the first integrated circuit is connected to a carrier substrate.

34. The chip stack of claim 30, wherein the second buffer circuit of the second integrated circuit is also coupled between the third external connection of the second integrated circuit and the memory circuit of the second integrated circuit, wherein, in the slave mode of operation of the second integrated circuit, the second circuit is configured to drive address data from the third external connection of the second integrated circuit to the memory circuit of the second integrated circuit, and wherein the second external connection of the first integrated circuit is connected to the third external connection of the second integrated circuit.

35. The chip stack of claim 31, wherein the integrated circuit configured to operate in the master mode of operation is configured to decode an address information to provide a chip select signal for the integrated circuit configured to operate in the slave mode of operation.

36. A data processing system, comprising:
a processor; and
a memory module coupled to the processor;
wherein the memory module comprises at least one integrated circuit;
wherein the integrated circuit comprises
a first external connection,
a second external connection,
a third external connection,
a memory circuit, and
a first buffer coupled between the first external connection and the memory circuit;
wherein the integrated circuit is switchable between a master mode of operation, in which the first buffer is activated and in which data is received via the first external connection and the received data is forwarded to another integrated circuit via the second external connection, and a slave mode of operation, in which the first buffer is deactivated and in which data exchange with the memory circuit is performed via the third external connection, and
wherein the second external connection is geometrically positioned opposite the third external connection on opposing main surfaces of the memory chip such that when two identical memory chips are stacked one on top of the other, the second external connection of one of the two memory chips is in electrical contact with the third external connection of the second one of the two memory chips.

37. An integrated circuit being configured as a memory chip, comprising:
first means for exchanging data;
second means for exchanging data;
third means for exchanging data;
means for storing data;
means for communicating data between the first means for exchanging data and the means for storing data; and
means for switching the integrated circuit between a master mode of operation, in which the means for communicating data is activated and in which data is received via the first means for exchanging data and the received data is forwarded to another integrated circuit via the second means for exchanging data, and a slave mode of operation, in which the means for forwarding data is deactivated and in which data exchange with the means for storing data is performed via the third means for exchanging data,
wherein the second means for exchanging data is geometrically positioned opposite the third means for exchanging data on opposing main surfaces of the memory chip such that when two identical memory chips are stacked one on top of the other, the second means for exchanging data of one of the two memory chips is in electrical contact with the third means for exchanging data of the second one of the two memory chips.

38. An integrated circuit, comprising:
a first external connection for an exchange of data;
a second external connection for an exchange of the data;
a third external connection for an exchange of the data;
a memory circuit; and
a bidirectional switchable interface circuited between the first external connection and a data port of the memory circuit, circuited between the first external connection and the second external connection, and circuited between the first external connection and the third external connection;

wherein the integrated circuit is configured to be operated in a master mode of operation and in a slave mode of operation;

wherein the bidirectional switchable interface is configured to provide an effective electrical coupling between the first external connection and the second external connection in the master mode of operation, or to provide an effective electrical coupling between the first external connection and the memory circuit in the master mode of operation;

wherein the bidirectional switchable interface is configured to allow for a data exchange between the third external connection and the data port of the memory circuit in the slave mode of operation, or to allow for a data exchange between the second external connection and the third external connection in the slave mode of operation;

wherein the second external connection and the third external connection are chip-to-chip connections;

wherein the second external connection and the third external connection are located at opposite main surfaces of the integrated circuit;

wherein the integrated circuit comprises an address input configured to receive an access address information for the integrated circuit, wherein the address input is arranged on a same main surface of the integrated circuit as the third external connection;

wherein the integrated circuit is adapted to operate in the master mode of operation if a default address is present at the address input;

wherein the address input is a chip-to-chip connection;

wherein the integrated circuit comprises an address output configured to provide a modified address information on the basis of the input access address information received via the address input, wherein modified address information describes a different address when compared to the input access address information, and wherein the address output is arranged on the same main surface of the chip as the second external connection, wherein the integrated circuit is configured such that the second external connection of the chip is in contact with the third external connection of a second chip, which is identical to the chip, when the second chip is stacked on the chip, and such that the address output is in contact with the address input of the second chip when the second chip is stacked on the chip; and wherein the integrated circuit is configured such that the chip is placed in the slave mode of operation when the chip is stacked on an identical chip, which is in the master mode of operation.

* * * * *